United States Patent
Kano

(10) Patent No.: US 10,145,466 B2
(45) Date of Patent: Dec. 4, 2018

(54) EQUIPMENT CONTROL APPARATUS FOR VEHICLE

(71) Applicant: KABUSHIKI KAISHA TOKAI-RIKA-DENKI-SEISAKUSHO, Aichi (JP)

(72) Inventor: Yuichi Kano, Aichi (JP)

(73) Assignee: KABUSHIKI KAISHA TOKAI-RIKA-DENKI-SEISAKUSHO, Aichi-Ken (JP)

( * ) Notice: Subject to any disclaimer, the term of this patent is extended or adjusted under 35 U.S.C. 154(b) by 0 days.

(21) Appl. No.: 15/547,740

(22) PCT Filed: Jan. 7, 2016

(86) PCT No.: PCT/JP2016/050345
§ 371 (c)(1),
(2) Date: Jul. 31, 2017

(87) PCT Pub. No.: WO2016/132754
PCT Pub. Date: Aug. 25, 2016

(65) Prior Publication Data
US 2017/0363200 A1 Dec. 21, 2017

(30) Foreign Application Priority Data
Feb. 16, 2015 (JP) ................................. 2015-027982

(51) Int. Cl.
*B60K 20/00* (2006.01)
*F16H 59/04* (2006.01)
(Continued)

(52) U.S. Cl.
CPC ......... *F16H 59/0278* (2013.01); *B60R 16/02* (2013.01); *B60R 16/0231* (2013.01);
(Continued)

(58) Field of Classification Search
CPC .............. F16H 59/0278; F16H 63/42; F16H 2063/426; G01R 29/12; B60R 16/0231
See application file for complete search history.

(56) References Cited

U.S. PATENT DOCUMENTS 9,064,663 B2 * 6/2015 Taka ..................... H01H 57/00
2011/0240751 A1 10/2011 Rauh et al.
2013/0162564 A1 6/2013 Adachi et al.

FOREIGN PATENT DOCUMENTS

EP 2821912 A1 1/2015
JP 2000-168468 A 6/2000
(Continued)

OTHER PUBLICATIONS

International Search Report issued in a corresponding application PCT/JP2016/050345 dated Mar. 15, 2016.
(Continued)

*Primary Examiner* — Jake Cook
(74) *Attorney, Agent, or Firm* — Roberts Mlotkowski Safran Cole & Calderon, P.C.

(57) ABSTRACT

An equipment control apparatus for a vehicle has: a motor for vibrating that imparts, via a shift knob that contacts a vehicle occupant, vibrations as a stimulus that the vehicle occupant can feel by a somatic sensation; an electrostatic capacity sensor that detects electrostatic capacity as a state of contact of the vehicle occupant with the shift knob; and a control section that controls driving of the motor for vibrating so as to impart, to the vehicle occupant, vibrations of a strength that is determined in advance in accordance with the electrostatic capacity detected by the electrostatic capacity sensor.

6 Claims, 5 Drawing Sheets

(51) Int. Cl.
*F16H 59/02* (2006.01)
*B60R 16/02* (2006.01)
*B60R 16/023* (2006.01)
*F16H 63/42* (2006.01)
*G01R 29/12* (2006.01)
*G06F 3/01* (2006.01)
*G06F 3/041* (2006.01)
*G06F 3/0354* (2013.01)
*H01H 3/00* (2006.01)

(52) U.S. Cl.
CPC ............. *F16H 63/42* (2013.01); *G01R 29/12* (2013.01); *G06F 3/016* (2013.01); *G06F 3/03547* (2013.01); *G06F 3/0416* (2013.01); *F16H 2063/426* (2013.01); *H01H 2003/008* (2013.01)

(56) References Cited

FOREIGN PATENT DOCUMENTS

| | | |
|---|---|---|
| JP | 2008-162466 A | 7/2008 |
| JP | 2012-216205 A | 11/2012 |
| JP | 2013-134716 A | 7/2013 |
| JP | 2015-018523 A | 1/2015 |
| WO | 2013/175778 A1 | 11/2013 |

OTHER PUBLICATIONS

Extended European Search Report issued in corresponding European Application No. 16752143.4 dated Sep. 5, 2018.

\* cited by examiner

EQUIPMENT CONTROL APPARATUS FOR VEHICLE

CROSS-REFERENCE TO RELATED APPLICATIONS

The present application is a U.S. National Phase of PCT/JP2016/050345 filed on Jan. 7, 2016 claiming priority to Japanese Patent application No. 2015-027982 filed Feb. 16, 2015. The disclosure of the PCT Application is hereby incorporated by reference into the present Application.

TECHNICAL FIELD

The present invention relates to an equipment control apparatus for a vehicle that controls equipment that is installed in a vehicle.

BACKGROUND ART

An equipment that imparts a stimulus that a vehicle occupant can feel by a somatic sensation is an example of equipment that is installed in a vehicle. Concretely, there are an information transmitting device that transmits information to a vehicle occupant by vibrations, a temperature adjusting device such as a seat heater or a steering wheel heater or the like, and the like.

As examples of information transmitting devices, there are those that transmit information to a vehicle occupant by generating vibrations at the steering wheel, as in the techniques described in Japanese Patent Application Laid-Open (JP-A) No. 2008-162466 and JP-A No. 2000-168468.

JP-A No. 2008-162466 and JP-A No. 2000-168468 propose providing a transducer or a vibrating motor or the like that generates vibrations at the handle portion of a steering wheel, and that transmits information such as a warning or the like to the vehicle occupant by vibrating the handle portion.

SUMMARY OF INVENTION

Technical Problem

However, in a case of generating vibrations as a stimulus that is imparted to a vehicle occupant as in JP-A No. 2008-162466 and JP-A No. 2000-168468, the way that the vibrations are felt differs in accordance with the state of contact of the vehicle occupant with the handle portion. Because consideration has not been given to the strength of vibration, there is room for improvement.

Further, this is not limited to the strength of vibrations, and, in a case in which there is equipment such as a seat heater or the like, the way that the temperature is felt differs in accordance with the state of contact of the vehicle occupant. Therefore, it is preferable to set a heater strength or the like that corresponds to the state of contact of the vehicle occupant. Namely, also for other equipment that imparts stimuli that a vehicle occupant can feel by somatic sensations, it is similarly preferable to control the driving to a strength that corresponds to the state of contact of the vehicle occupant.

The present invention was made in view of the above-described circumstances, and an object thereof is to impart a stimulus to a vehicle occupant at an appropriate strength in accordance with the state of contact of the vehicle occupant.

Solution to Problem

In order to achieve the above-described object, an equipment control apparatus for a vehicle of the present invention comprises: an imparting section that imparts, via a contacting portion that contacts a vehicle occupant, a stimulus that the vehicle occupant can feel by a somatic sensation; a detecting section that detects a state of contact of the vehicle occupant with the contacting portion; and a control section that controls driving of the imparting section so as to impart, to the vehicle occupant, a stimulus of a strength that is determined in advance in accordance with the state of contact detected by the detecting section.

In accordance with the present invention, the imparting section imparts, via the contacting portion that contacts the vehicle occupant, a stimulus that the vehicle occupant can feel by a somatic sensation. The stimulus that the vehicle occupant can feel by a somatic sensation is imparted due to, for example, vibrations or a change in temperature such as heat or the like being imparted to the vehicle occupant as the stimulus. As an example, a vibration generating portion that vibrates the contacting portion may be applied as the imparting section.

The detecting section detects the state of contact of the vehicle occupant with the contacting portion by detecting, for example, electrostatic capacity, pressure, strain or the like.

Further, at the control section, driving of the imparting section is controlled so as to impart, to the vehicle occupant, a stimulus of a strength that is set in advance in accordance with the detected state of contact. Due thereto, stimulus of an appropriate strength can be imparted in accordance with the state of contact of the vehicle occupant.

Note that the detecting section may detect, as the state of contact, electrostatic capacity between the vehicle occupant and the contacting portion, or may detect an amount of contact of the vehicle occupant with the contacting portion. Here, in a case in which the detecting section detects the electrostatic capacity, the control section may control driving of the imparting section so as to impart, to the vehicle occupant, a stimulus whose strength is greater the greater the electrostatic capacity detected by the detecting section. Further, in a case in which the detecting section detects the amount of contact, the control section may control driving of the imparting section so as to impart, to the vehicle occupant, a stimulus whose strength is smaller the greater the amount of contact detected by the detecting section.

Note that the control section may control a duty ratio of electric power that drives the imparting section, so as to impart a stimulus of a strength that is determined in advance in accordance with the state of contact.

Advantageous Effects of Invention

As described above, in accordance with the present invention, there is the effect that a stimulus can be imparted to a vehicle occupant at an appropriate strength in accordance with a state of contact of the vehicle occupant.

DESCRIPTION OF EMBODIMENTS

Figure 1:
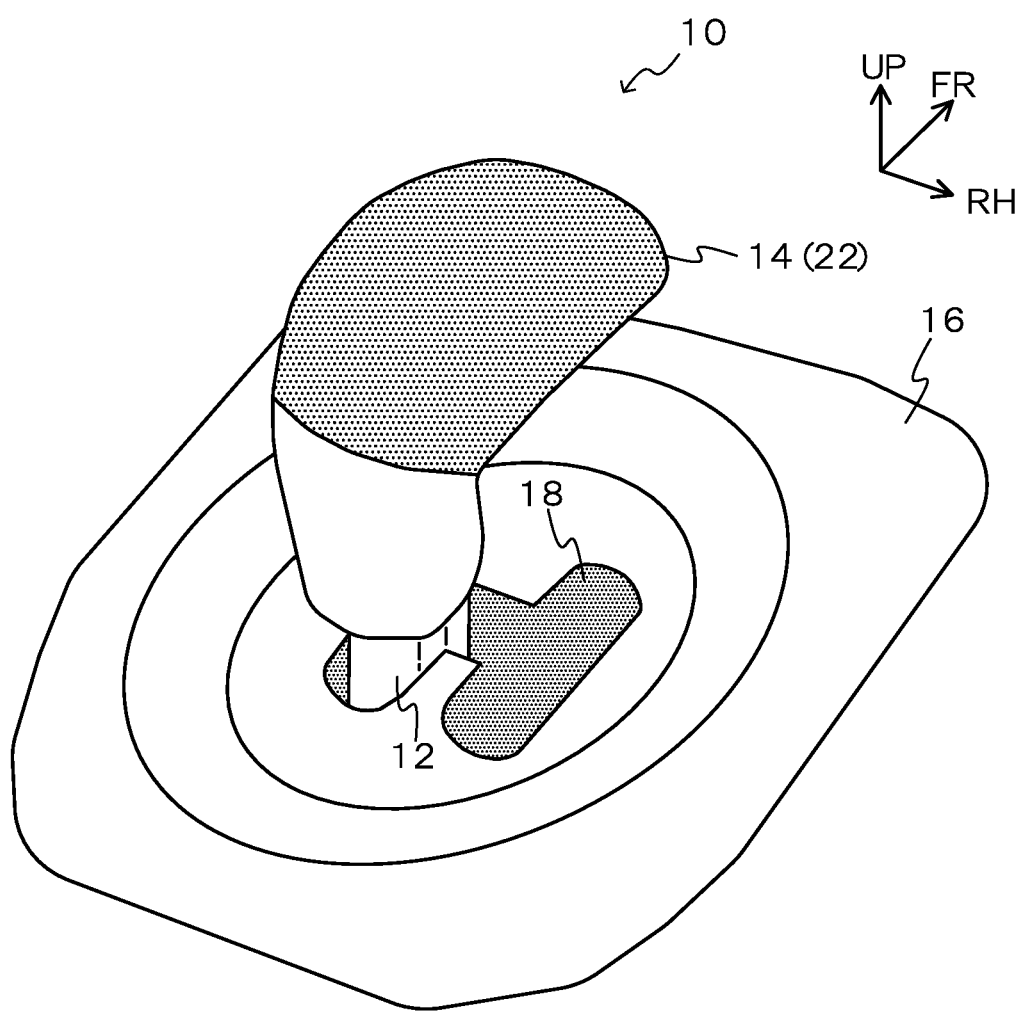
FIG. 1 is an overall elevation showing a shift device at which an information transmitting device relating to a present embodiment is provided.

An example of an embodiment of the present invention is described in detail hereinafter with reference to the drawings. In the present embodiment, description is given by using an information transmitting device, which transmits information by vibrations, as an example of an equipment control apparatus for a vehicle. FIG. 1 is an overall elevation showing a shift device at which the information transmitting device relating to the present embodiment is provided. Note that, in the drawings, the front side of a shift device 10 is indicated by FR, the right side of the shift device 10 is indicated by RH, and the upper side of the shift device 10 is indicated by UP. Further, explanation is given with the shift device 10 relating to the present embodiment being for a right hand drive vehicle.

The shift device 10 relating to the present embodiment is applied to a vehicle (an automobile), and selection of the gear of the transmission is carried out by the shift device 10. Explanation is given with the shift device 10 being disposed such that the front side, right side and upper side thereof are directed toward the vehicle front side, the vehicle right side and the vehicle upper side, respectively. Note that the shift device 10 may be disposed at the floor of the vehicle cabin interior, or may be disposed at the instrument panel or the steering column or the like.

As shown in FIG. 1, at the shift device 10, a shift knob 14 is mounted to a shift lever 12. The gear of the transmission can be selected due to a vehicle occupant operating the shift knob 14 and moving the shift lever 12.

The shift device 10 has a cover 16. A groove 18 is formed in the cover 16. The shift lever 12 is made to be movable along the groove 18 that is formed in the cover 16.

Further, an electrostatic capacity sensor 22 that serves as a detecting section is provided at the shift knob 14 in order to detect the state of contact of the vehicle occupant with the shift knob 14. The electrostatic capacity sensor 22 is provided at the portion of the shift knob 14 which portion is contacted by the hand of the vehicle occupant (the hatched portion in FIG. 1), and detects the electrostatic capacity that is generated between the hand of the vehicle occupant and the shift knob 14.

Figure 2A:
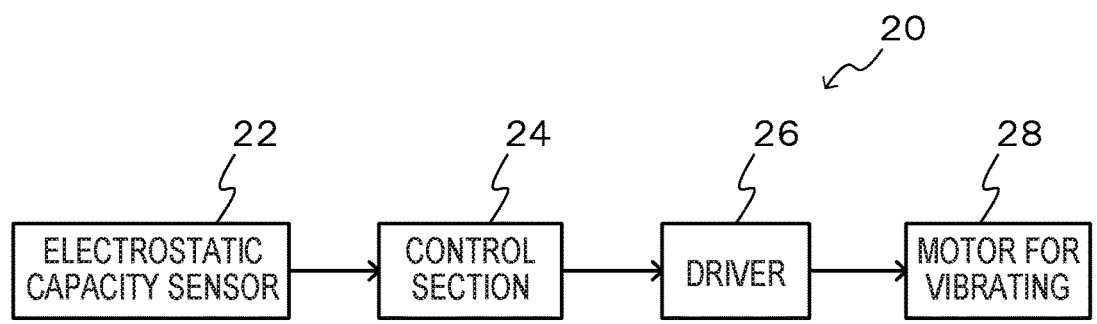
FIG. 2A is a block drawing showing the structure of the information transmitting device relating to the present embodiment.
Figure 2B:
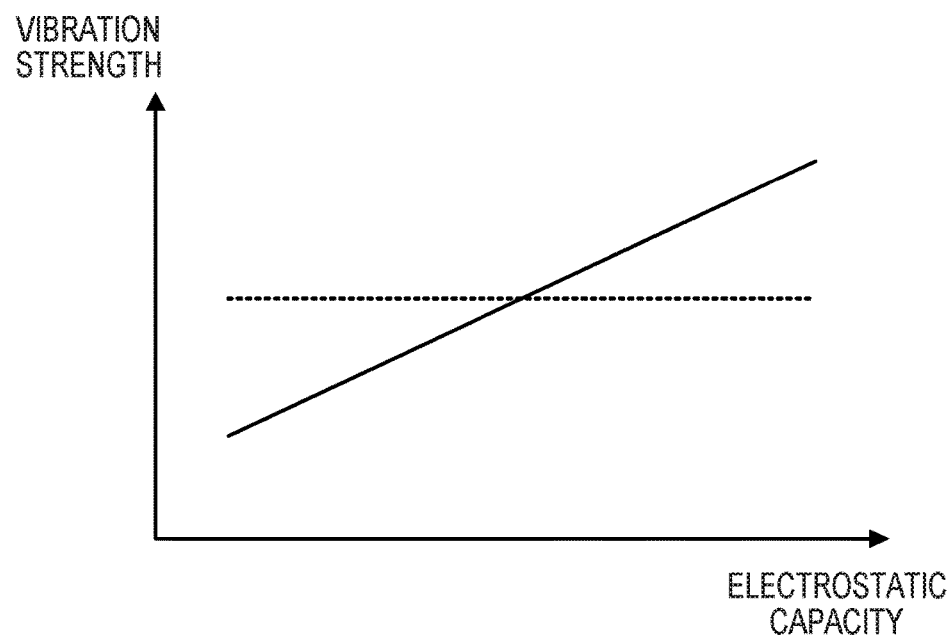
FIG. 2B is a drawing showing vibration strength at the time of transmitting information at the information transmitting device relating to the present embodiment.

FIG. 2A is a block drawing showing the structure of the information transmitting device relating to the present embodiment. FIG. 2B is a drawing showing an example of vibration strength at the time of transmitting information in the present embodiment.

As shown in FIG. 2A, an information transmitting device 20 has the above-described electrostatic capacity sensor 22, a motor 28 for vibrating that serves as an imparting section, a driver 26, and a control section 24.

As described above, the electrostatic capacity sensor 22 is provided at the shift knob 14, and detects the state of contact of the vehicle occupant by detecting the electrostatic capacity that is generated between the hand of the vehicle occupant and the shift knob 14. Further, the results of detection are inputted to the control section 24.

The motor 28 for vibrating imparts vibrations that serve as a stimulus that the vehicle occupant can feel by a somatic sensation (a sensation that is felt by surface layer tissue (skin/membranes) or deep tissue (muscles/tendons and the like) of the body, including cutaneous sensations such as tactile sensations, temperature sensations, and pain, and deep sensations such as vibration sensations and the like). In the present embodiment, due to vibrations being generated at the shift knob 14, the vibrations are imparted to the vehicle occupant as a stimulus, and various types of information such as a warning or the like are transmitted.

The driver 26 drives the motor 28 for vibrating in accordance with instructions from the control section 24. In the present embodiment, for example, the driver 26 drives the motor 28 for vibrating by PWM (Pulse Width Modulation) control, and changes the duty ratio. Due thereto, the vibration strength of the motor 28 for vibrating can be made to be variable. Note that the vibration strength may be made to be variable not by PWM control, but by changing the magnitude of the electric power, such as the current value or the voltage value or the like, that is applied to the motor 28 for vibrating.

By the way, the electrostatic capacity that is generated between the hand of the vehicle occupant and the shift knob 14 is a value that is greater the larger the hand of the vehicle occupant is. Thus, in the present embodiment, the control section 24 estimates the size of the hand of the vehicle occupant from the results of detection of the electrostatic capacity sensor 22. Then, because the larger the hand of the vehicle occupant is, the harder it is for the vehicle occupant to feel vibrations, and the stronger the tendency is for the vehicle occupant to prefer stronger vibrations, the control section 24 effects control so as to drive the motor 28 for vibrating at a vibration strength that is set in advance in accordance with the estimated size of the hand. Namely, the control section 24 controls the driver 26 and carries out driving control of the motor 28 for vibrating so as to transmit information at a vibration strength that is suited to the size of the hand.

Concretely, as shown in FIG. 2B, the control section 24 controls the driver 26 and drives the motor 28 for vibrating such that, the greater the electrostatic capacity that is detected by the electrostatic capacity sensor 22, the greater the vibration strength is. For example, the relationship of correspondence of vibration strengths that correspond to electrostatic capacities, which relationship is shown in FIG. 2B, is stored in advance in the control section 24, the vibration strength corresponding to the electrostatic capacity is read-out, and the driving of the motor 28 for vibrating is controlled. Due thereto, conventionally, information was transmitted at a constant vibration strength as shown by the dotted line in FIG. 2B, but, in the present embodiment, information can be transmitted at an appropriate vibration strength in accordance with the size of the hand (the electrostatic capacity).

Figure 3:
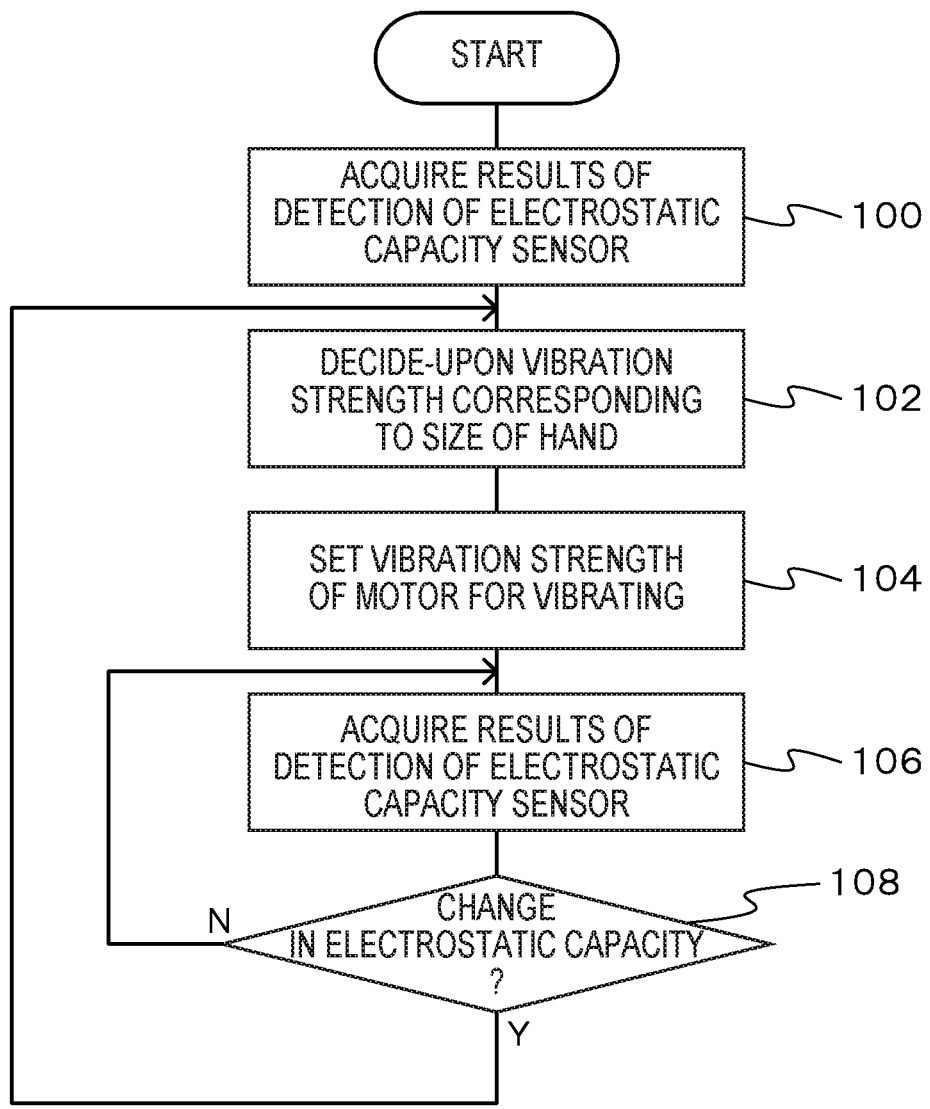
FIG. 3 is a flowchart showing an example of the flow of processings that are carried out at a control section of the information transmitting device relating to the present embodiment.

Processings that are carried out at the control section 24 of the information transmitting device 20, which relates to the present embodiment and is structured as described above, are described next. FIG. 3 is a flowchart showing an example of the flow of processings that are carried out at the control section 24 of the information transmitting device 20 relating to the present embodiment.

In step 100, the control section 24 acquires the results of detection of the electrostatic capacity sensor 22, and the routine moves on to step 102.

In step 102, the control section 24 decides upon the vibration strength that corresponds to the size of the hand, and the routine move on to step 104. Namely, the control section 24 decides upon the vibration strength on the basis of the predetermined relationship of correspondence of vibration strengths that correspond to electrostatic capacities that express sizes of hands.

In step 104, the control section 24 sets the vibration strength of the motor for vibrating with respect to the driver 26, and the routine moves on to step 106. For example, the control section 24 sets the driver 26 so as to apply, to the motor 28 for vibrating, current of a duty ratio corresponding to the vibration strength that was decided upon. Due thereto, the motor 28 for vibrating is driven at a vibration strength that is suited to the size of the hand.

In step 106, the control section 24 acquires the results of detection of the electrostatic capacity sensor 22, and the routine moves on to step 108.

In step 108, the control section 24 judges whether or not there is a change in the electrostatic capacity. If this judgment is negative, the routine returns to step 106, and the above-described processings are repeated. If this judgment is affirmative, the routine returns to step 102, and the above-described processings are repeated.

In this way, in the present embodiment, the control section 24 estimates the size of the hand by detecting the electrostatic capacity, and vibrates the shift knob 14 at a vibration strength that is suited to the estimated hand size, and can transmit information.

Figure 4A:
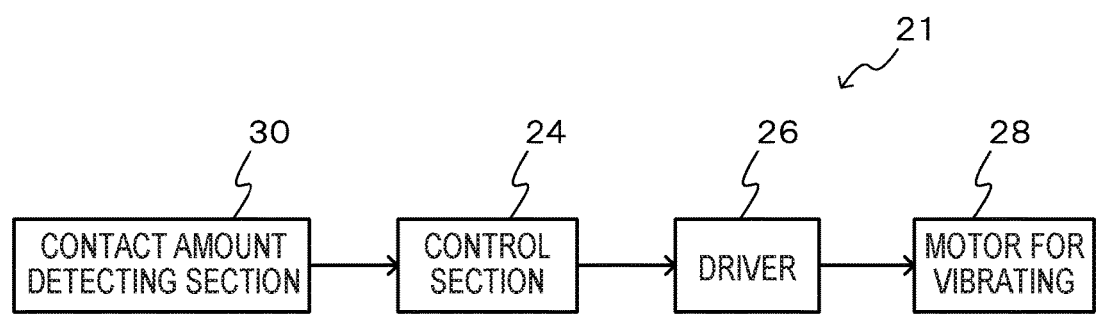
FIG. 4A is a block drawing showing the structure of an information transmitting device relating to a modified example.
Figure 4B:
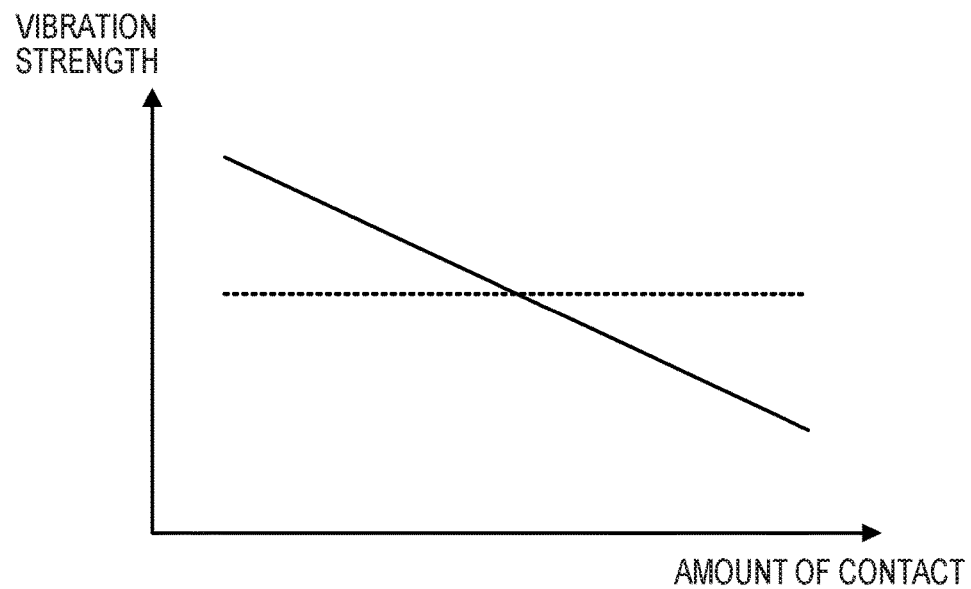
FIG. 4B is a drawing showing an example of vibration strength at the time of transmitting information in the modified example.

A modified example of the information transmitting device relating to the present embodiment is described next. FIG. 4A is a block diagram showing the structure of the information transmitting device relating to the modified example. FIG. 4B is a drawing showing an example of the vibration strength at the time of transmitting vibrations in the modified example. Note that portions that are the same as the above-described embodiment are denoted by the same reference numerals, and description thereof is omitted.

The above embodiment describes an example in which, because there is the tendency that, the larger the hand of the vehicle occupant is, the harder it is for the vehicle occupant to feel vibrations, the motor 28 for vibrating is controlled so as to vibrate at a vibration strength that is stronger the larger the hand is (the larger the electrostatic capacity is). In contrast, in the modified example, vibrations are generated while changing the vibration strength in accordance with the amount of contact with the shift knob 14, and not in accordance with the size of the hand.

In the modified example, the vibration strength is controlled from the standpoint that, the greater the amount of contact with the shift knob 14, the easier it is for vibrations to be felt, and, the smaller the amount of contact, the harder it is for vibrations to be felt.

As shown in FIG. 4A, an information transmitting device 21 relating to the modified example has a contact amount detecting section 30 instead of the electrostatic capacity sensor 22 of the above-described embodiment.

The contact amount detecting section 30 can be structured by any of various types of sensors such as a piezoelectric sensor, a strain sensor, an electrostatic capacity sensor, or the like, and, for example, detects the amount of contact of the hand of the vehicle occupant with respect to the shift knob 14 (e.g., a value corresponding to the surface area of contact) as the state of contact. Concretely, the any of various types of sensors is disposed at the shift knob 14 in the form of a matrix, and detects the amount of contact of the hand of the vehicle occupant with the shift knob 14, and outputs the results of detection to the control section 24.

The control section 24 stores, in advance, a relationship of correspondence of vibration strengths that correspond to amounts of contact, and decides upon a vibration strength that corresponds to the amount of contact. Then, the control section 24 controls the driver 26 and drives the motor 28 for vibrating so as to generate vibrations at the shift knob 14 at the vibration strength that was decided upon.

Concretely, as shown in FIG. 4B, the control section 24 controls the driver 26 and drives the motor 28 for vibrating such that, the greater the amount of contact, the smaller the vibration strength. Due thereto, conventionally, information was transmitted at a constant vibration strength as shown by the dotted line in FIG. 4B. However, in the present embodiment, information is transmitted at a vibration strength that is suited to the amount of contact with the shift knob 14.

Figure 5:
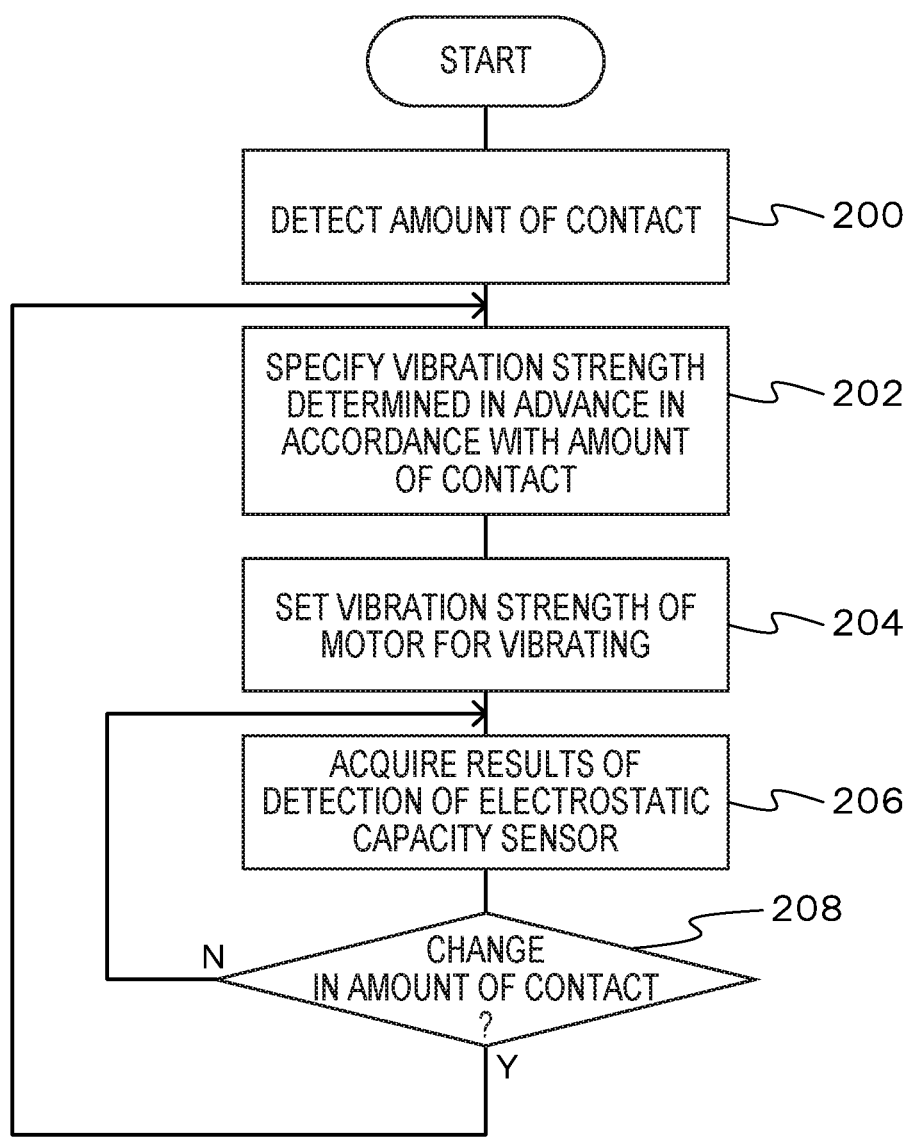
FIG. 5 is a flowchart showing an example of the flow of processings that are carried out at the control section of the information transmitting device relating to the modified example.

Processings that are carried out at the control section 24 of the information transmitting device 21, which relates to the modified example and is structured as described above, are described next. FIG. 5 is a flowchart showing an example of the flow of processings that are carried out at the control section 24 of the information transmitting device 21 relating to the modified example.

In step 200, the control section 24 acquires the results of detection of the contact amount detecting section 30, and the routine moves on to step 202.

In step 202, the control section 24 decides upon the vibration strength that corresponds to the detected amount of contact, and the routine moves on to step 204. Namely, the control section 24 decides upon the vibration strength on the basis of the predetermined relationship of correspondence of vibration strengths that correspond to amounts of contact.

In step 204, the control section 24 sets the vibration strength of the motor for vibrating with respect to the driver 26, and the routine moves on to step 206. For example, the control section 24 sets the driver 26 so as to apply, to the motor 28 for vibrating, current of a duty ratio corresponding to the vibration strength that was decided upon. Due thereto, the motor 28 for vibrating is driven at a vibration strength that is suited to the amount of contact of the vehicle occupant with the shift knob 14.

In step 206, the control section 24 acquires the results of detection of the contact amount detecting section 30, and the routine moves on to step 208.

In step 208, the control section 24 judges whether or not there is a change in the amount of contact. If this judgment is negative, the routine returns to step 206, and the above-described processings are repeated. If this judgment is affirmative, the routine returns to step 202, and the above-described processings are repeated.

In this way, in the present embodiment, the control section 24 detects the amount of contact of the vehicle occupant with the shift knob 14, and vibrates the shift knob 14 at a vibration strength that is suited to the estimated amount of contact, and can transmit information.

Note that, in the above-described embodiment and modified example, description is given by using an example in which the shift knob 14 is vibrated by the motor 28 for vibrating, but the present invention is not limited to this. For example, another portion such as the steering wheel or a vehicle seat or the like may be vibrated, and not the shift knob 14.

Further, the above-described embodiment and modified example describe an example of imparting vibrations to the vehicle occupant by the motor 28 for vibrating, but the stimulus that the vehicle occupant can feel by a somatic sensation is not limited to this. For example, a stimulus may be imparted to the vehicle occupant by heat or wind or the like, other than vibrations. Concretely, a seat heater, in which a heater is provided at at least one of the seat cushion and the seat back, or seat air conditioning, in which air is blown-out from the air conditioner toward a vehicle seat, or the like, may be applied. Namely, it suffices to detect the state of contact of the vehicle occupant in the same way as in the above-described embodiment and modified example, and to control the driving of the heater or the blower fan at a strength that corresponds to the results of detection. Due thereto, temperature adjustment that corresponds to the state of contact of the vehicle occupant is possible, and the comfort can be improved.

Moreover, the present invention is not limited to the above, and, other than the above, can of course be implemented by being modified in various ways within a scope that does not depart from the gist thereof.

The disclosure of Japanese Patent Application No. 2015-027982 that was filed on Feb. 16, 2015 is, in its entirety, incorporated by reference into the present specification.

The invention claimed is:

1. An equipment control apparatus for a vehicle, comprising:
    an imparting section that imparts, via a contacting portion that contacts a vehicle occupant, a stimulus that the vehicle occupant can feel by a somatic sensation;
    a detecting section that detects a state of contact of the vehicle occupant with the contacting portion; and
    a control section that controls driving of the imparting section so as to impart, to the vehicle occupant, a stimulus of a strength that is determined in advance in accordance with the state of contact detected by the detecting section,
    wherein the detecting section detects, as the state of contact, electrostatic capacity between the vehicle occupant and the contacting portion.

2. The equipment control apparatus for a vehicle of claim 1, wherein the imparting section comprises a vibration generating portion that vibrates the contacting portion.

3. The equipment control apparatus for a vehicle of claim 1, wherein the control section controls driving of the imparting section so as to impart, to the vehicle occupant, a stimulus whose strength is greater, the greater the electrostatic capacity detected by the detecting section.

4. The equipment control apparatus for a vehicle of claim 1, wherein the detecting section detects, as the state of contact, an amount of contact of the vehicle occupant with the contacting portion.

5. The equipment control apparatus for a vehicle of claim 4, wherein the control section controls driving of the imparting section so as to impart, to the vehicle occupant, a stimulus whose strength is smaller, the greater the amount of contact detected by the detecting section.

6. The equipment control apparatus for a vehicle of claim 1, wherein the control section controls a duty ratio of electric power that drives the imparting section, so as to impart a stimulus of a strength that is determined in advance in accordance with the state of contact.

* * * * *